US005532676A

United States Patent [19]
Moore, III

[11] Patent Number: 5,532,676
[45] Date of Patent: Jul. 2, 1996

[54] BATTERY SWITCH FOR RAM BACKUP

[75] Inventor: Harry W. Moore, III, Watkins Glen, N.Y.

[73] Assignee: Mitel, Inc., Reston, Va.

[21] Appl. No.: 235,257

[22] Filed: Apr. 29, 1994

[51] Int. Cl.$^6$ ....................................................... H02J 9/00
[52] U.S. Cl. .................... 327/545; 320/5; 320/9; 365/229; 307/66
[58] Field of Search ............................. 327/63, 108, 61, 327/111, 112, 403, 405, 473, 534, 536, 533, 538, 545; 320/5, 9, 10, 14, 22; 365/229; 307/66

[56] References Cited

U.S. PATENT DOCUMENTS

| | | | |
|---|---|---|---|
| 4,672,293 | 6/1987 | Crampton | 320/14 |
| 5,007,027 | 4/1991 | Shimoi | 365/229 |
| 5,241,508 | 8/1993 | Berenguel et al. | 365/229 |
| 5,278,798 | 1/1994 | Miyawaki | 365/229 |

FOREIGN PATENT DOCUMENTS

| | | | |
|---|---|---|---|
| 1160933 | 1/1964 | Germany | 320/10 |
| 1046163 | 10/1966 | United Kingdom . | |
| 2143094 | 1/1985 | United Kingdom . | |

Primary Examiner—Timothy P. Callahan
Assistant Examiner—Jung Ho Kim
Attorney, Agent, or Firm—Laff, Whitesel, Conte & Saret, Ltd.

[57] ABSTRACT

A charging circuit for a random access memory (RAM) backup battery for supplying a first charge current from a voltage supply to the battery for as long as the voltage supply is present, comprised of a first resistance apparatus for limiting the first charge current to a low predetermined value, a bypass conducting switch connected in parallel with the first resistance apparatus, and apparatus for detecting a low voltage condition of the voltage supply and for enabling operation of the bypass conducting switch thereby bypassing the first resistance apparatus and allowing discharge current to flow from the battery to the RAM.

7 Claims, 2 Drawing Sheets

BATTERY SWITCH FOR RAM BACKUP

FIELD OF THE INVENTION

This invention relates to battery chargers, and in particular to a variable rate battery charger suited for use to charge a backup battery for a random access memory (RAM) such as a static random access memory (SRAM).

BACKGROUND TO THE INVENTION

RAMs such as SRAMs require backup batteries to which they are constantly connected in order to maintain the data stored therein, although the current drawn from such backup batteries is very small, e.g. 50 ua. NiCd batteries are typically used as the backup batteries. As is well known, such rechargeable batteries lose charge even when current is not drawn from them. Consequently, in a computer environment they must be continuously charged, typically at a rate of about 5 to 10 ma. This continuous high charge rate has been found to limit the lifetimes of such batteries.

Under some conditions, substantially more current is required to be drawn from the battery, and sometimes the charging voltage rail drops in voltage. This limits the charging current, and at the same time can reduce the amount of current that can be drawn by the RAM, endangering the data. Prior art RAM backup battery charging circuits have been unable to compensate for these deficiencies, at reasonable cost.

SUMMARY OF THE INVENTION

The present invention provides a battery charging circuit for RAM backup batteries which provides variable charging rates for the backup batteries. At the same time it does so at only very small increase in cost over the prior art RAM backup battery charging circuit.

In accordance with the present invention, a charging circuit for a random access memory (RAM) backup battery continuously supplies a small "trickle" charge current from a voltage supply to the battery for as long as the voltage supply is present, comprising a first resistance apparatus for limiting the first charge current to a low predetermined value, a bypass conducting switch connected in parallel with the first resistance apparatus, and apparatus for detecting a low voltage condition of the voltage supply and for enabling operation of the bypass conducting switch thereby bypassing the first resistance apparatus and allowing discharge current to flow from the battery to the RAM.

BRIEF INTRODUCTION TO THE DRAWINGS

A better understanding of the invention will be obtained by reading the description of the invention below, with reference to the following drawings, in which.

DETAILED DESCRIPTION OF THE INVENTION

Figure 1:
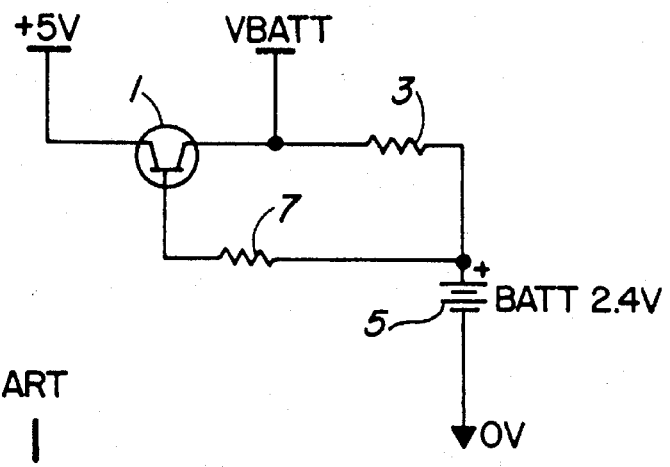
FIG. 1 is a schematic diagram of a prior art battery charging circuit.

FIG. 1 illustrates a battery charging circuit in accordance with the prior art. A battery charging voltage supply, shown as +5 V, is connected in series with the emitter-collector circuit of a PNP bipolar transistor 1. The latter circuit is connected in series with a current limiting resistor 3 to the + pole of a battery 5 to be charged. The opposite pole of the battery 5 is connected to ground, which is returned to the voltage supply.

A resistor 7 connects the + pole of the battery to the base of transistor 1. Current is drawn to a random access memory from the junction of the resistor 3 and the collector of transistor 1, and the location marked VBATT.

In operation, the voltage of the battery is always lower than the +5 VRAIL so the base-emitter junction of transistor 1 is forward biased. Forward biasing of the base-emitter circuit of transistor 1 causes conduction in its emitter-collector circuit, providing both current to the RAM via VBATT and charging current from the voltage supply to the battery.

The prior art circuit is only capable of charging the battery at a sustained charging current, typically of 5 to 10 ma. on a continuous basis. Unfortunately this limits the life of the battery substantially.

Figure 2:
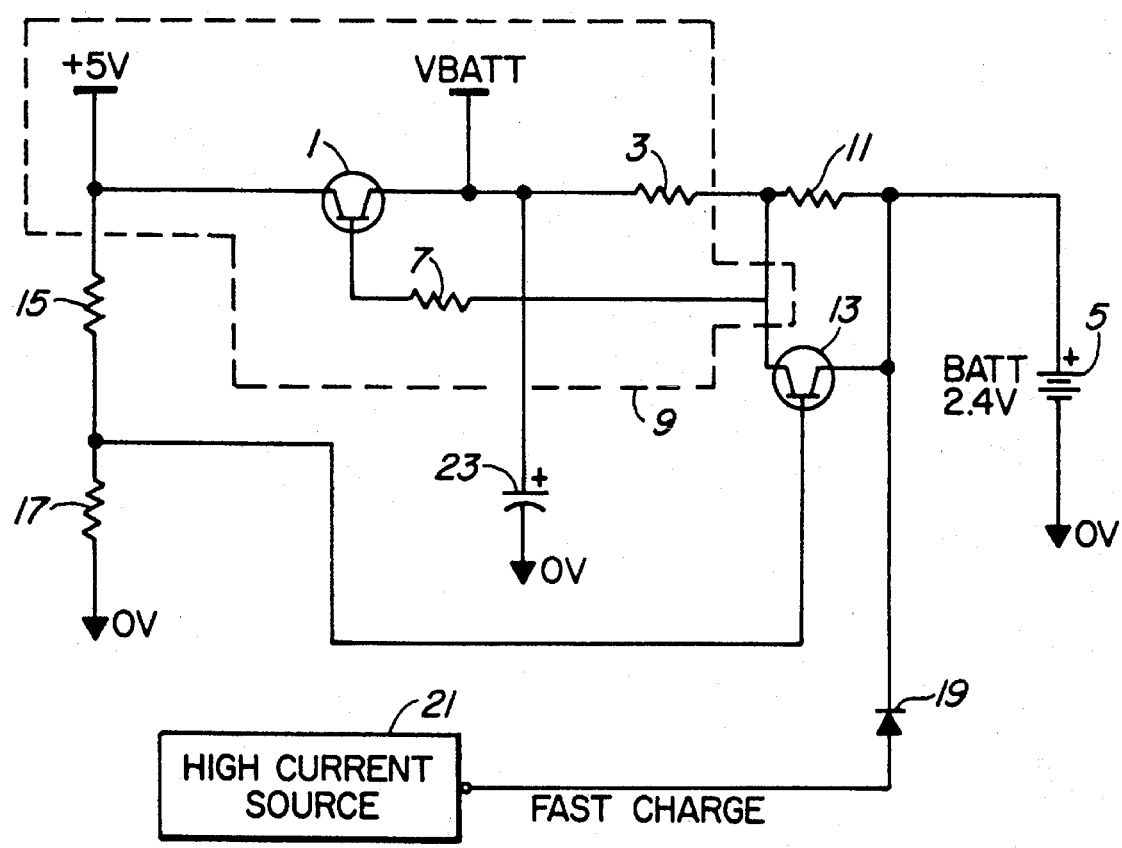
FIG. 2 is a schematic diagram of an embodiment of the present invention.

A schematic diagram of a circuit illustrating an embodiment of the present invention is shown in FIG. 2. A portion of the embodiment that generally corresponds to the prior art circuit of FIG. 1 is shown within the dashed line box labelled 9.

In the embodiment of FIG. 2, instead of the resistor 7 being connected to the battery 5, it and resistor 3 are connected to one terminal of a relatively high valued resistor 11, the other terminal of which is connected to the + terminal of battery 5. The collector-emitter circuit of a second bipolar PNP transistor 13 is connected in parallel with resistor 11.

The base of transistor 13 is connected to the tap of a voltage divider comprised of resistors 15 and 17 which is connected between the voltage source +5 V and ground. This tap provides a voltage reference for enabling of transistor 13.

The cathode of a diode 19 is connected to the emitter of transistor 13, and to the + terminal of battery 5. A high current source 21 is connected to the anode of diode 19.

In operation, when +5 volt power is applied to the voltage divider formed of resistors 15 and 17, the base-emitter circuit of transistor 13 is held in a reverse biased condition. To achieve this, the value of resistor 15 can be e.g. 200 kohms and the value of resistor 17 can be e.g. 1 megohm. Transistor 1 is conducting, and the output voltage VBATT is very close to 5 volts. In this state, the current through resistor 11 is about 50 ua., with resistor 3 being about 30 kohms and resistor 11 being about 100 kohms.

To bring about a high charging current, a logic gate or latch in high current source 21 pulls up the anode voltage of diode 19. This causes the emitter to become forward biased relative to the base of transistor 13, causing its emitter-collector circuit to conduct if the collector voltage is below the emitter voltage, which will be the case if the +5 volt rail is at reduced voltage. Since high current charging only occurs when the system, of which this circuit is a part, is powered up, VBATT is supplied by transistor 1 and transistor 13.

On the other hand if the +5 V supply voltage rail drops in voltage, the voltage at the voltage divider junction between resistors 15 and 17 drops, tending to forward bias the emitter-base junction of transistor 13, causing it to conduct and bypass resistor 11. Thus this can provide current from battery 5 to VBATT, compensating for the lost current from the main supply.

It will be recognized that there will be current transitions caused by switching of transistor 13. These transitions may be compensated for by connecting a capacitor 23 (e.g. 10 uf.) between the output terminal VBATT and ground. The capacitor charges, and gives up current during transition periods, thus ensuring that the RAM connected to the VBATT terminal sees no interruption in its current. However, if the components used are fast enough, the capacitor may be dispensed with.

Figure 3:
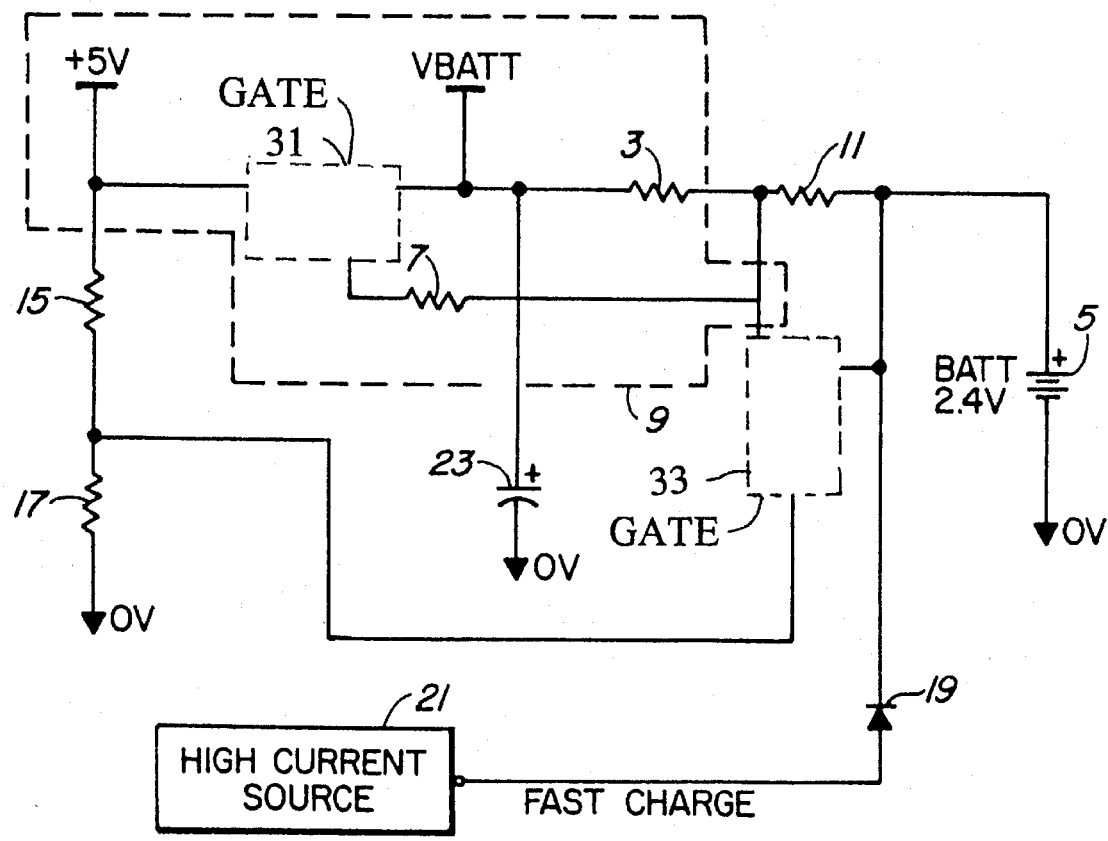
FIG. 3 is a schematic diagram of another embodiment of the invention.

Transistors 1 and 13 may be replaced with transmission gates 31 and 33 as shown in FIG. 3, such as two sections of a 4066 quad transmission gate. A CMOS latch or flip flop and driver stage can be used in the high current source 21.

The present invention thus provides a high/low charge rate selection that can use the output current of a CMOS latch or other logic circuits to provide the high current used in one operation mode of the invention. The bypass transistor 13 or equivalent transmission gate provides means for altering the charge and current discharge rates of the present invention. The cost of the present invention is only slightly higher than that of the prior art circuit, and provides for both high and low charge rates as well as a rapid switchover to protect the contents of an ultra low current draw CMOS static RAM.

The duration of the high current charge can be determined by external logic, for example a microprocessor and associated program, which may for example control the circuit to the high current charge state for the first 24 hours after any power up condition.

A person understanding this invention may now conceive of alternative structures and embodiments or variations of the above. All of those which fall within the scope of the claims appended hereto are considered to be part of the present invention.

I claim:

1. A charging circuit for a random access memory (RAM) backup battery connected to a RAM, for supplying a first charge current from a voltage supply to the battery and to the RAM for as long as the voltage supply is at a nominal voltage, comprising:
   (a) a first resistance means connected in series between the battery and the RAM for limiting said first charge current to a low predetermined value,
   (b) a bypass conducting switch connected in parallel with the first resistance means,
   (c) means for detecting a low voltage condition of the voltage supply which is lower than the nominal voltage and for enabling operation of the bypass conducting switch thereby bypassing the first resistance means and allowing discharge current to flow from the battery to the RAM, and
   (d) a diode connected from a high current drive source to the battery, and
   (e) means for applying a voltage level to the diode sufficient to cause it to conduct a high charging current from the high current drive source to the battery.

2. A circuit as defined in claim 1 further including a capacitor connected to an output of the circuit for providing current to the RAM during a switchover interval from a voltage supply state to a battery supply state.

3. A circuit as defined in claim 1 further including a means for applying said first charge current, and in which the detecting means and means for applying said first charge current are comprised of a first bipolar PNP transistor having an emitter connected to the voltage supply, a base having a first resistor connected thereto and a collector having a second resistor connected thereto; said first resistance means comprising a third resistor having one terminal connected to the first and second resistors together and another terminal connected to the backup battery, the means for detecting the low voltage condition of the voltage supply comprising a resistor voltage divider, and the bypass conducting switch comprising a second bipolar PNP transistor having a collector and emitter connected in parallel with the third resistor and a base connected to a voltage divider point of the resistor voltage divider.

4. A circuit as defined in claim 3 further including a capacitor connected to an output of the circuit for provide current to the RAM during a switchover interval from a voltage supply state to a battery supply state.

5. A charging circuit for a random access memory (RAM) backup battery connected to a RAM for supplying a first charge current from a voltage supply to the battery for as long as the voltage supply is at a nominal voltage, comprising:
   (a) a first resistance means in series between the battery and the RAM for limiting said first charge current to a low predetermined value,
   (b) a bypass conducting switch connected in parallel with the first resistance means,
   (c) means for detecting a low voltage condition of the voltage supply which is lower than the nominal voltage and for enabling operation of the bypass conducting switch thereby bypassing the first resistance means and allowing discharging current to flow from the battery to the RAM, and
   (d) means for applying said first charge current comprised of a first transmission gate connected to the voltage supply and connected in series with a first resistor and
   (e) the bypass conducting switch being comprised of a second transmission gate.

6. A circuit as defined in claim 5, further comprising a diode connected from a high current drive source to the battery, means for applying a voltage to the diode having a level sufficient to cause the diode to conduct a high charging current from the high current drive source to the battery and at the same time to inhibit application of the first charge current from the voltage supply to the battery.

7. A circuit as defined in claim 6 further including a capacitor connected to an output of the circuit for providing current to the RAM during a switchover interval from a voltage supply state to a battery supply state.

* * * * *